United States Patent [19]

Cunningham, Jr.

[11] 3,974,450
[45] Aug. 10, 1976

[54] DUAL FREQUENCY FM RECEIVER
[75] Inventor: Charles Cunningham, Jr., Indianapolis, Ind.
[73] Assignee: Regency Electronics, Inc., Indianapolis, Ind.
[22] Filed: July 16, 1975
[21] Appl. No.: 596,512

[52] U.S. Cl. .............................. 325/344; 343/206; 325/437
[51] Int. Cl.² ........................................ H04B 1/06
[58] Field of Search .......... 325/344, 351, 364, 437, 325/31; 343/206

[56] References Cited
UNITED STATES PATENTS
1,764,751  6/1930  Roberts ........................... 325/437
2,955,199  10/1960  Mindes ............................ 343/206
3,035,171  5/1962  Manke ............................. 325/31

Primary Examiner—Thomas B. Habecker
Attorney, Agent, or Firm—Woodard, Weikart, Emhardt & Naughton

[57] ABSTRACT

A receiver is disclosed which will receive signals on either one of two closely spaced frequencies. The receiver is of the superheterodyne type and has a local oscillator frequency midway between the two frequencies which the receiver is tuned to. The receiver also includes a tone squelch circuit which mutes the audio unless a tone is received for a period of time.

10 Claims, 4 Drawing Figures

DUAL FREQUENCY FM RECEIVER

BACKGROUND OF THE INVENTION

1. Field of the Invention

The invention relates to superheterodyne receivers and in particular relates to superheterodyne receivers which can receive signals on either of two separate frequencies.

2. Description of the Prior Art

Conventionally radio receivers which received signals on two separate frequencies have done so in a sequential fashion. Either the receiver could be manually tuned from one frequency to another or the receiver automatically and periodically sampled each of two or more frequencies. To build a receiver which is capable of receiving either one of two FM signals in a VHF band typically required one crystal for each frequency to which the receiver could be tuned. Highly expensive circuitry could eliminate the need for individual crystals but the resultant cost was increased. For radio receivers designed to monitor weather bureau frequencies of 162.4 MHz and 162.55 MHz, receivers required two separate crystals. While single frequency receivers could be designed to receive signals on either of the two weather frequencies, these single frequency receivers presented problems in marketing since it depended upon the location of the user as to which of the two frequencies was more appropriate.

Radio receiving circuits are known which do receive signals on two separate frequencies. Such radios are normally referred to as diversity radios. FIG. 4 of U.S. Pat. No. 2,955,199 discloses a circuit for receiving a signal on either one of two frequencies. In this circuit an oscillator located precisely midway between the two frequencies produces an IF signal. The amplitude modulation of the IF signal is detected and used to control the phase of the local oscillator. This then assures that the local oscillator functions precisely between the two received signals. This receiver is intended to be used in a diversity system in which two identically modulated signals are normally present on the two received frequencies. The precise phase control allows additive combination of the two signals without substantial distortion. It is therefore essential that the local oscillator be controlled by the incoming signals. A lack of control would defeat the improvement of the signal-to-noise ratio which is one of the advantages of a diversity system.

SUMMARY OF THE INVENTION

The precise definition of the invention is set forth in the claims. Reference should be made thereto for determining the precise definition of the invention. The invention generally relates to a superheterodyne receiver for receiving frequency modulated (or phase modulated) signals on one of two frequencies which are relatively close together. The receiver uses a local oscillator which is crystal controlled and operates at a frequency which is both independent of received signals and essentially midway between the two frequencies. It has an RF signal receiving means with a bandpass broad enough for reception of signals on either of the two frequencies and has a mixer for mixing the signals from the RF signal receiving means with the output of the local oscillator. Because the receiver is designed for receiving frequencies which are close together, the IF bandpass filter is essentially a relatively low frequency device (preventing signals below 10 kHz and above 250 kHz from passing through). The frequency or phase modulation components of the signal passing through the IF bandpass filter are detected and audio produced therefrom.

The invention can be further modified by incorporation of tone squelch circuitry. The resulting receiver provides an extremely inexpensive receiver for monitoring two frequencies. The receiver merely needs a single crystal oscillator of simple design to provide the mixer injection frequency and the RF amplifier can be of simple design for amplifying the two separate frequencies. The receiver can be marketed for use with either of the two input frequencies without the previously expressed problem of having to have a different crystal for different frequencies. In the event a person with the receiver of the present invention moves from an area having a weather bureau transmitter at 162.4 MHz to an area having a weather bureau transmitter at 162.55 MHz, he will find that his receiver is operative (in contrast to single channel crystal controlled receivers of the prior art). The capture effect of the FM receiver prevents in most instances two signals with different modulation from interfering with each other. Preferably this is accomplished in part by having substantial limiting in the FM receiver. A receiver of the invention would operate above 30 MHz.

DESCRIPTION OF THE PREFERRED EMBODIMENT

Figure 1:
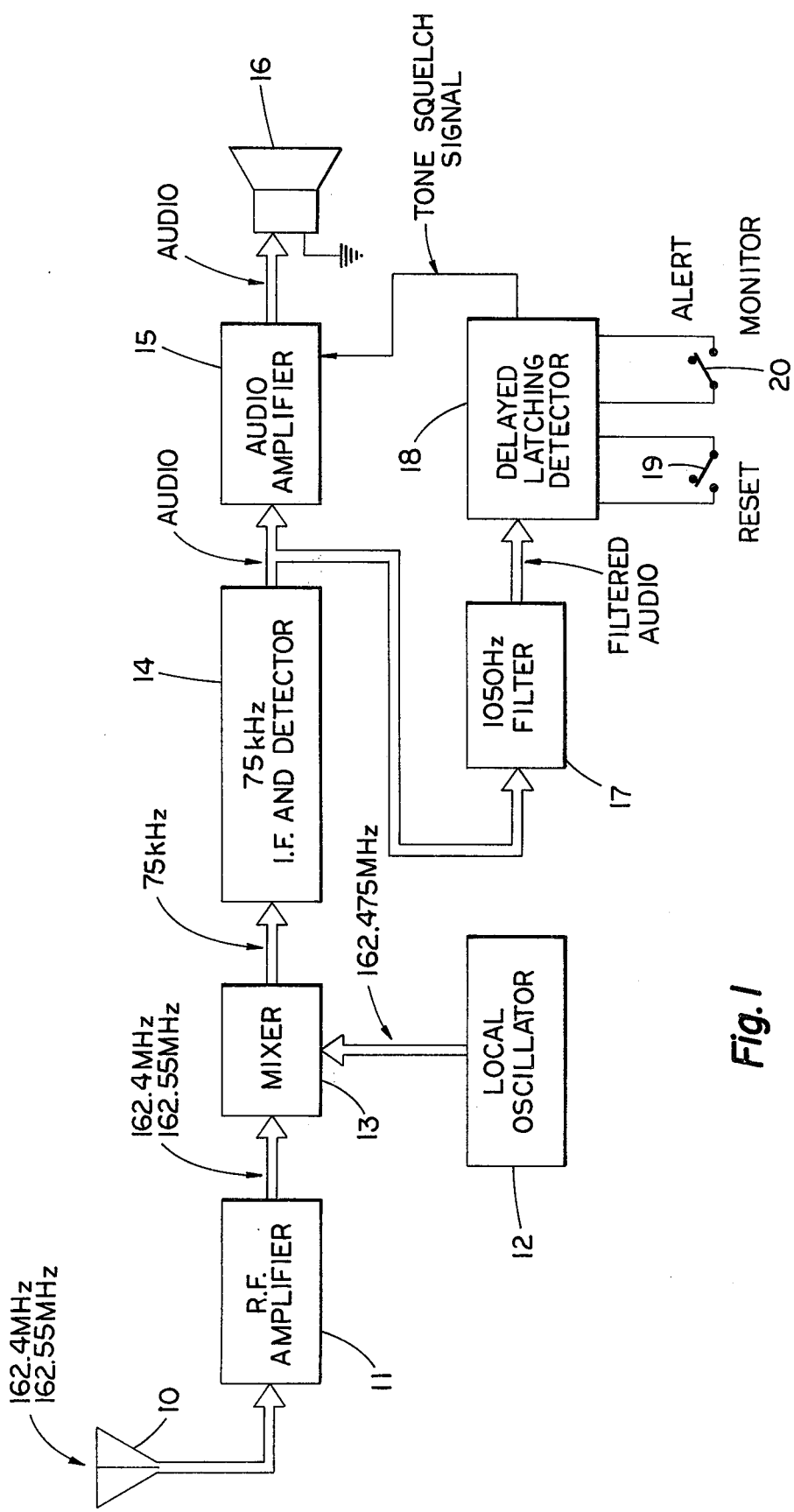
In FIG. 1 there is illustrated a block diagram of the superheterodyne receiver of the invention.

Referring to FIG. 1 in particular, there is illustrated a superheterodyne receiver for receiving frequency modulated signals on one of two frequencies which are less than 500 kHz apart. As used herein, the term "frequency modulation" is intended to encompass both frequency modulation and phase modulation. The receiver of FIG. 1 is the type for reception above 50 MHz and in particular is designed to receive frequencies of both 162.4 MHz and 162.55 MHz. The receiver has an antenna 10 and an RF amplifier 11 which serve as signal receiving means and which have a bandpass broad enough for reception of signals on either of the two frequencies. At the output of the RF amplifier there appears amplified signals on 162.4 MHz and 162.55 MHz when such signals are present at the antenna 10.

A local oscillator 12 is a crystal controlled oscillator which operates at a frequency, nominally 162.475 MHz, which is independent of received signals and essentially midway between the two frequencies. The output of the local oscillator 12 is mixed with the signal from RF amplifier 11 to produce nominal 75 kHz signals whenever a 162.4 MHz or 162.55 MHz signal is present at the antenna. The output of mixer 13 is passed through an IF bandpass filter. In the preferred embodiment this filter prevents (50 dB attenuation) signals from below 55 kHz and above 95 kHz from passing through and being detected. In the invention, the IF bandpass filter generally should at least prevent signals below 10 kHz and above 250 kHz from passing through and being detected. The detector portion of 75 kHz IF and detector 14 detects the frequency modulation content of the IF signal and produces an audio frequency electrical signal at its output. This audio output signal is connected to audio amplifier 15 which if unsquelched produces a high power audio frequency electrical signal for driving speaker 16 which produces audio for the listener to hear.

A tone squelch circuit which includes a 1050 Hz filter 17 and a delayed latching detector 18 is used to prevent production of audio from the audio amplifier 15 until a tone is received and thereafter permitting production of audio. The audio frequency electrical signal from the 75 kHZ IF and detector 14 is filtered by the 1050 Hz filter 17 to produce a filtered audio signal. This filtered audio signal provides the input signal for a delayed latching detector 18 which produces a squelch signal muting audio amplifier 15 unless filtered audio is received for a sufficiently long time (2 seconds). The delayed latching detector can be controlled by closing reset switch 19. Reset switch 19 is a manually operable switch for preventing the production of audio until another tone is received. Switch 20 is a manually operable switch which can be moved from the "alert" to "monitor" position to readily disable the tone squelch circuitry to allow continuous monitoring of audio.

Figure 2:
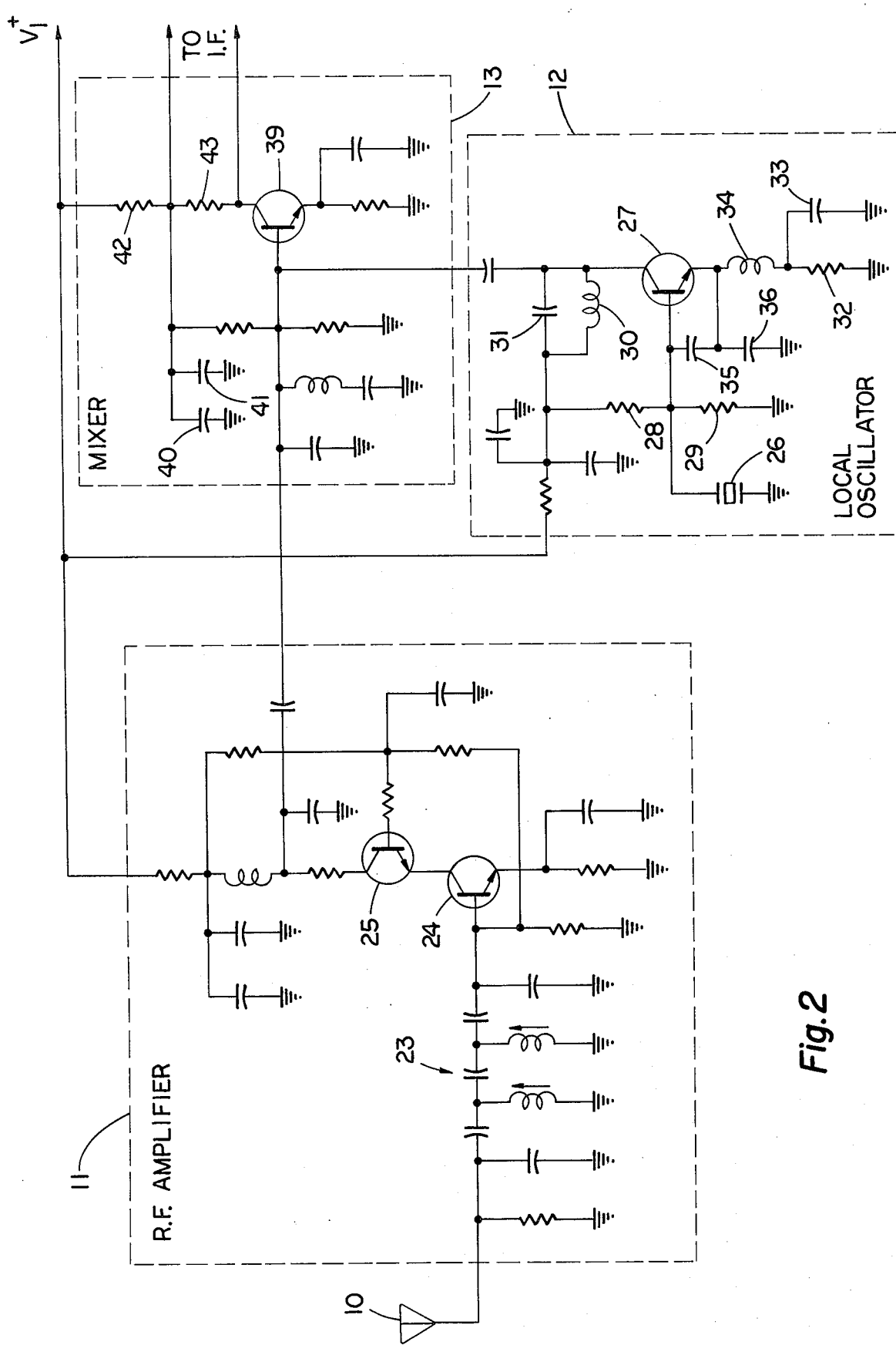
In FIG. 2 there is illustrated the antenna, RF amplifier, mixer and local oscillator portions of the block diagram of FIG. 1.

Referring in particular to FIG. 2 there is illustrated in more detail, circuitry from portions of the block diagram of FIG. 1. The antenna 10 connects through a relatively narrow bandpass circuit 23 of conventional design to amplifying transistors 24 and 25. The transistors with their associated circuitry provide gain to the signals which pass through the bandpass circuit 23. A local oscillator 12 includes a quartz piezoelectric crystal 26 which is caused to oscillate by transistor 27 and associated circuitry. This oscillator includes base bias resistors 28 and 29 as well as a tuned circuit at the collector which includes inductor 30 and capacitor 31 designed to resonate at the oscillator operating frequency of 162.475 MHz. The oscillator transistor circuit includes an emitter bias resistor 32 which is by-passed with capacitor 33. Inductor 34 and capacitors 35 and 36 are used to provide the appropriate phase relationship within the oscillator to achieve a highly stable oscillator. It can be noted that the local oscillator does not have AFC and operates at a frequency and phase which is independent of received signals.

The output of the local oscillator 12 is mixed in mixer 13 with the signals from RF amplifier 11 through the use of transistor 39 and associated circuitry. Two filter capacitors 40 and 41 provide an AC ground at the juncture between the two collector resistors 42 and 43. The output from the mixer is then derived between the collector of transistor 39 and the juncture of resistors 42 and 43.

Figure 3:
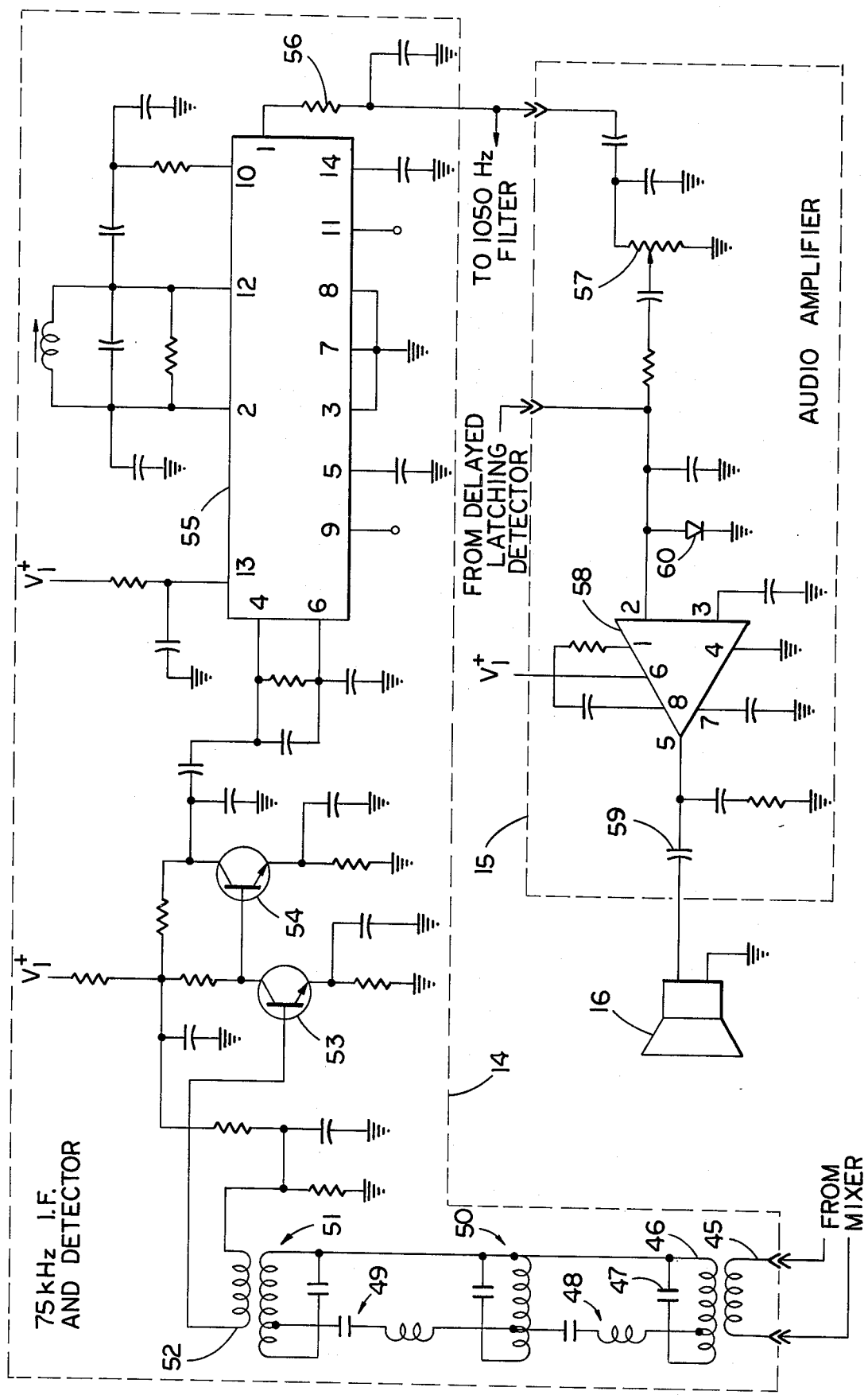
In FIG. 3 there is illustrated the IF and detector circuitry and the audio amplifier circuitry and speaker of FIG. 1.

In FIG. 3 it can be seen that this output from mixer 13 connects to primary windings 45 at the input of the 75 kHz IF detector 14. The secondary windings 46 are connected in parallel with a capacitor 47 to provide a resonant circuit. The output of this resonant circuit at proper impedance is taken from a tap on the secondary winding 46 and passes through a series resonant circuit 48 and connects to a tapped inductance of a parallel resonant circuit 50. This connects further through another series resonant circuit 49 to a third parallel resonant circuit 51 at a tap on the inductance thereof. The output of this filter network is taken through winding 52 which is inductively coupled to the inductive portion of parallel resonant circuit 51. The net effect of the three parallel resonant circuits and two series resonant circuits is to provide a bandpass for passing essentially only frequencies between about 55 kHz and about 95 kHz. The filtered IF signal is amplified through amplifying stages which include transistors 53 and 54 and is further processed by an integrated circuit 55 which functions to amplify and limit the signal and then detect frequency modulation components therein. Integrated circuit 55 is preferably a Motorola model no. MC 1357 with pin connections as shown, but alternatively maybe a Sprague model ULN 2111 or a National model LM 2111. The electrical signal which represents the detected audio feeds through resistor 56 to the output point of the 75 kHz IF detector. This output connects to the input of audio amplifier 15.

Audio amplifier 15 includes a volume control 57 which adjusts the audio level to the input of an integrated circuit amplifier which preferably is a model LM 386 amplifier. The output of the amplifier 58 then couples through capacitor 59 to speaker 16 to produce audio for the user to listen to. Diode 60 is used in the squelching of the audio amplifier by being made conductive when it is wished to squelch the audio. The conducting of diode 60 thereby shorts the input to amplifier 58 to ground and prevents any audio output from speaker 16. Current through diode 60 is controlled by the connections from the delayed latching detector 18. DC level shift on pin 2 also gates off the LM386.

Figure 4:
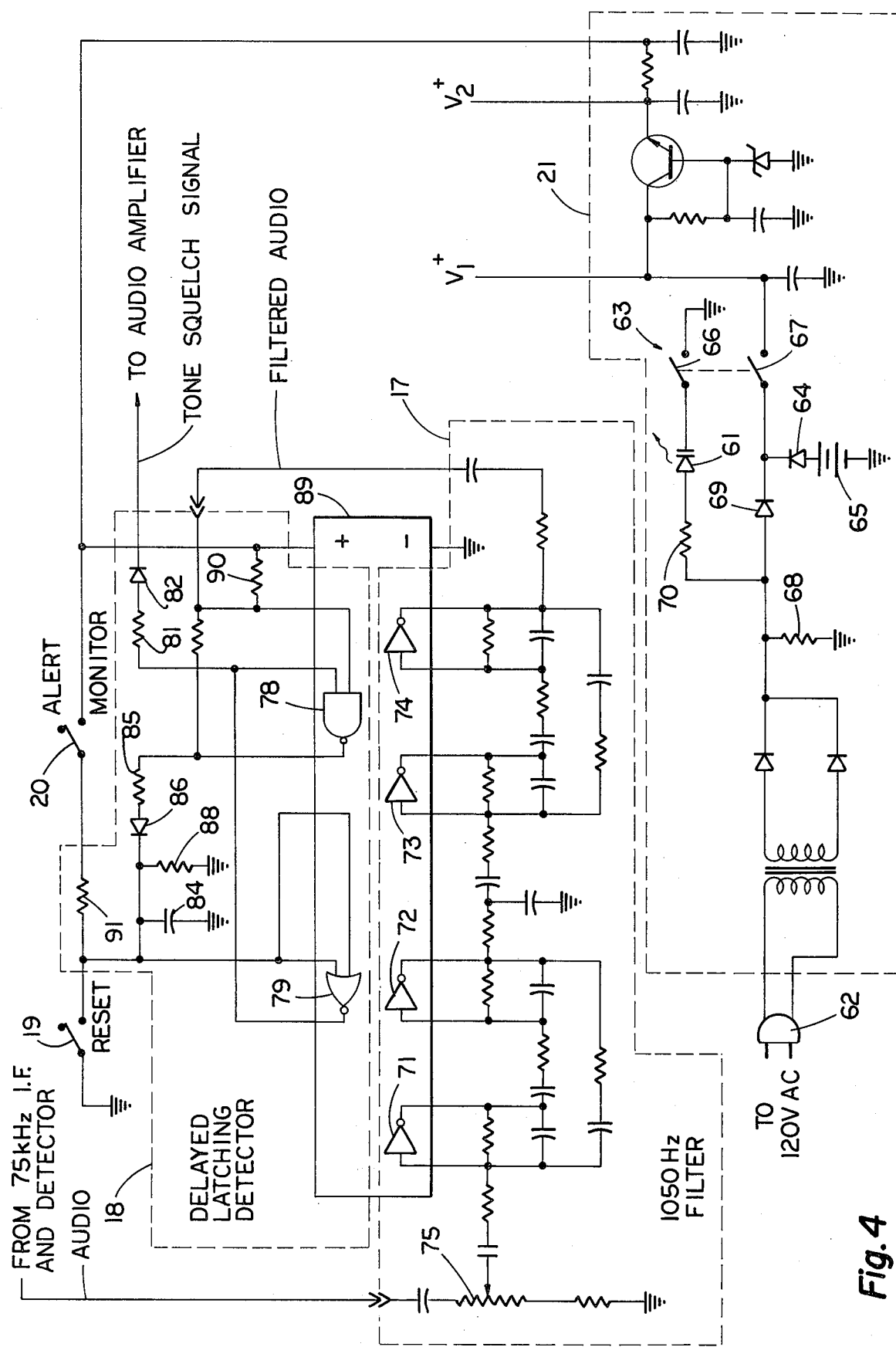
In FIG. 4 there is illustrated the tone squelch circuitry of FIG. 1 which includes a delayed latching detector and a 1050 Hz filter. In addition, in FIG. 4 there is illustrated a power supply which is to be used with the circuit of the block diagram of FIG. 1 and which is used with the circuits of FIGS. 2, 3 and 4.

Referring now in particular to FIG. 4 there is illustrated the power supply circuitry and the tone squelch circuitry. The power supply circuitry 21 is of relatively conventional design except for the circuitry associated with the light emitting diode 61. This diode operates whenever the receiver is turned on with switch 63, but only if the receiver is being powered by the conventional AC voltage. This AC voltage is obtained when plug 62 is inserted into a standard electrical outlet connected to a 120 volt AC 60 Hz, supply.

If there is no power being supplied from a 120 volt AC supply then the voltage produced by battery 65 will cause current to flow through diode 64 and switch contacts 67 to power the receiver. Diode 69 prevents illumination of the light emitting diode 61 when the unit is being operated from battery 65. Diode 69 additionally helps to protect the battery 65 from current drain due to resistor 68 which functions to regulate to some extent the DC voltage produced when the receiver is connected to an AC supply. Since resistor 68 draws substantial current for regulation and since a battery does not need this type of regulation, diode 69 is used to isolate the resistor 68 from the battery 65. Therefore the light emitting diode 61 provides an indication of operation of the receiver only when it is being powered from a 120 volt supply. A resistor 70 limits the current through the light emitting diode to achieve an appropriate value for operation of the diode. By constructing the circuit in this manner, the light emitting diode does not operate when the radio is being powered by a battery thereby conserving the life of the battery and prolonging the time the radio will operate without replacement or recharging.

The tone squelch circuitry has in its first portion a 1050 Hz filter 17 which is a rather broadly tuned single tone filter which includes four inverting amplifiers 71 through 74 with associated RC circuits to achieve the desired filtering. A potentiometer 75 is used to adjust the level into the filter to achieve an adjustment of the squelch operation. The output of the 1050 Hz filter connects to the input of the delayed latching detector 18. The delayed latching detector uses a NAND gate 78 and a NOR gate 79 wired as an inverting amplifier. Inverting amplifier 71 through 74 and gates 78 and 79 are a part of an integrated circuit package which is preferably a Motorola MC 14572 CP.

The closing of reset switch 19 with alert/monitor switch 20 in the alert position results in the grounding of the inputs of gate 79. This results in the output going high which provides a voltage at resistor 81 and diode 82 which causes current to flow to the audio amp 15 and through the squelching diode 60 previously referred to. This mutes the audio. At the same time the first input of NAND gate 78 which connects to NOR gate 79 is high. The second input of NAND gate 78 which connects to resistor 90 is normally by a high through the action of resistor 90. Both inputs of NAND gate 78 being high, the output is low and capacitor 84 does not become charged. When filtered audio of a sufficient level is present at the output of the 1050 Hz filter 17, the second input of NAND gate 78 periodically goes sufficiently low to produce a high output.

When this high output occurs, current flows through resistor 85 and diode 86 to charge capacitor 84. Resistor 88 tends to drain the charge off of capacitor 84 but if the filtered audio output remains high enough for a sufficiently long period of time, the charge on capacitor 84 will reach a sufficient level to provide a voltage at the inputs of NOR gate 79 sufficiently high to change the output state from high to low. When this occurs, the first input of NAND gate 78 will go low making the output of NAND gate 78 permanently high which will maintain the charge on capacitor 84 and result in a latched condition. At this same time the low output of NOR gate 79 by its connection through resistor 81 and diode 82 no longer squelches the audio amplifier. This circuit will then remain in this condition until the reset switch 19 is closed removing the charge from capacitor 84. If desired, switch 20 may be switched to the monitor position to provide a current path to charge capacitor 84 through resistor 91 thereby preventing the operation of the squelch circuit unless reset button 19 is maintained in a closed position.

While there have been described above the principles of this invention in connection with speccific apparatus, it is to be clearly understood that this description is made only by way of example and not as a limitation to the scope of the invention.

What is claimed is:
1. A superheterodyne receiver for receiving frequency modulated signals on one of two frequencies which are less than 500 kHz apart comprising:
   a. a local oscillator which operates at a frequency which is both independent of received signals and essentially midway between the two frequencies, said local oscillator being controlled in frequency by a piezoelectric crystal;
   b. R. F. signal receiving means having a bandpass broad enough for reception of signals on either of the two frequencies;
   c. a mixer for mixing signals from said R. F. signal receiving means with the output of said local oscillator;
   d. an I F bandpass filter coupled to the output of said mixer for preventing signals below 10 kHz and above 250 kHz from passing through;
   e. a frequency modulation detector connected to the output of said I F filter; and
   f. transducer means connected to the output of said frequency modulation detector for producing audio from the detected signal.

2. The receiver of claim 1 which additionally includes tone squelch means for preventing production of audio until a tone is received and for thereafter permitting production of audio, said tone squelch means including a manually operable reset switch means for again preventing production of audio until another tone is received.

3. The receiver of claim 2 in which said tone squelch means can be manually readily disabled to allow continuous monitoring of audio.

4. The receiver of claim 3 in which said tone squelch means is responsive to a 1050 Hz tone.

5. The receiver of claim 1 in which said receiver is for receiving frequency modulated signals on either 162.4 MHz or 162.55 MHz and in which said local oscillator operates at a frequency of essentially 162.475 MHz.

6. The receiver of claim 5 in which said I F bandpass filter passes essentially only frequencies between about 55 kHz and about 95 kHz.

7. The receiver of claim 5 which additionally includes tone squelch means for preventing production of audio until a tone is received and for thereafter permitting production of audio, said tone squelch means including a manually operable reset switch means for again preventing production of audio until another tone is received.

8. The receiver of claim 7 in which said tone squelch means can be manually readily disabled to allow continuous monitoring of audio.

9. The receiver of claim 8 in which said IF bandpass filter passes essentially only frequencies between about 55 kHz and about 95 kHz.

10. The receiver of claim 9 in which said tone squelch means is responsive to a 1050 Hz tone.

* * * * *